US008621941B2

(12) United States Patent
Mei et al.

(10) Patent No.: US 8,621,941 B2
(45) Date of Patent: Jan. 7, 2014

(54) FEEDBACK SYSTEM FOR IDENTIFYING MOVEMENT AND INTENSITY OF EXTERNAL FORCE

(75) Inventors: Jia-Xin Mei, Suzhou (CN); Gang Li, Suzhou (CN); Hong-Yuan Yang, Suzhou (CN)

(73) Assignee: Memsensing Microsystems Technology Co., Ltd., Suzhou, Jiangsu Province (CN)

( * ) Notice: Subject to any disclaimer, the term of this patent is extended or adjusted under 35 U.S.C. 154(b) by 538 days.

(21) Appl. No.: 12/910,797

(22) Filed: Oct. 23, 2010

(65) Prior Publication Data

US 2012/0042735 A1  Feb. 23, 2012

(30) Foreign Application Priority Data

Aug. 19, 2010  (CN) .......................... 2010 1 0257137

(51) Int. Cl.
  *G01L 1/02* (2006.01)
  *G01L 1/22* (2006.01)
  *G01L 1/04* (2006.01)
(52) U.S. Cl.
  USPC ............ 73/862.581; 73/862.044; 73/862.045; 73/862.627; 73/862.632; 73/862.474
(58) Field of Classification Search
  USPC ......... 345/173, 156, 169, 157, 158, 160, 161, 345/163; 73/862.632, 862.621, 862.625, 73/862.627, 862.581, 862.041–862.046
  See application file for complete search history.

(56) References Cited

U.S. PATENT DOCUMENTS

| 5,867,808 | A | 2/1999 | Selker et al. | |
|---|---|---|---|---|
| 6,222,528 | B1 | 4/2001 | Gerpheide et al. | |
| 7,167,157 | B2 * | 1/2007 | Tokimoto et al. | 345/156 |
| 2002/0149571 | A1 * | 10/2002 | Roberts | 345/174 |
| 2005/0190152 | A1 * | 9/2005 | Vaganov | 345/157 |
| 2006/0055671 | A1 * | 3/2006 | Tokimoto et al. | 345/157 |
| 2007/0257886 | A1 | 11/2007 | Uotani et al. | |
| 2009/0219176 | A1 * | 9/2009 | Ladouceur et al. | 341/22 |
| 2009/0237275 | A1 | 9/2009 | Vaganov | |
| 2011/0298705 | A1 * | 12/2011 | Vaganov | 345/156 |
| 2012/0218214 | A1 * | 8/2012 | Ciesla et al. | 345/173 |
| 2012/0235935 | A1 * | 9/2012 | Ciesla et al. | 345/173 |

* cited by examiner

*Primary Examiner* — Lisa Caputo
*Assistant Examiner* — Jonathan Dunlap
(74) *Attorney, Agent, or Firm* — Cheng-Ju Chiang

(57) ABSTRACT

A feedback system for identifying an external force, includes an operation plate and a pressure-sensing unit. The pressure-sensing unit includes an elastic member supporting the operation plate and a pressure sensor inside the elastic member. The pressure sensor includes a pressure sensitive film. An inner side of the elastic member is filled with fluid material which acts on the pressure sensitive film. The operation plate is driven by the external force to be slant which extrudes the elastic member to deform so as to change fluid pressure of the fluid material limited in the elastic member, and such change of the fluid pressure can be sensed by the pressure sensitive film of the pressure sensor so as to identify the movement and the intensity of the external force.

18 Claims, 16 Drawing Sheets

FEEDBACK SYSTEM FOR IDENTIFYING MOVEMENT AND INTENSITY OF EXTERNAL FORCE

BACKGROUND OF THE INVENTION

1. Field of the Invention

The present invention relates to a feedback system applied in Human-Machine Interface (HMI) for identifying movement and intensity of an external force.

2. Description of Related Art

Human-Machine Interface (HMI) plays a very important role in the development of the multimedia applications and directly influences the operating feelings of end users. Early, the only HMI is a keyboard which is constrainedly suitable for the applications based on command line interface and text interface, while is insufficient for processing graphics. In 1980s, mouse widely used in Mac computer accelerated the development of the graphics user interface. Till now, mouse and Windows operation system maintain major market of the multimedia applications. One of the disadvantages of mouse is its big profile so that it is not suitable for being used in small mobile equipments, such as handset, PDA and Notebook etc. Besides, a reasonable large space is needed for the movement of the mouse, which restricts the usage thereof. In 1990s, Ted Selker invented a TranckPoint (see U.S. Pat. No. 5,867,808) which was widely used in Thinkpad series notebook computers of IBM. After year 1994, George E. Gerpheide invented a touchpad (see U.S. Pat. No. 6,222,528) which was firstly used in PowerBook series notebook computers of Apple Inc. The above-mentioned two invention creations accelerate the development of the HMI which is applied in notebook computers.

Handheld terminals raise higher requests about the profile of input systems of the HMI, after entering into the mobile multimedia era. Japanese Sunarrow Ltd. had invented a kind of 3D sensor based on the capacitance-based touch theory (see U.S. Patent Publication No. 2007/0257886). Such products have been widely used in Nokia handsets. Besides, Veganov invented a handle operation system based on MEMS sensor (see U.S. Patent Publication No. 2009/0237275).

With the development of technologies, developing trends of the HMI are low profile, low cost, good interaction and friendly user experience, in order to be suitable for the rapid growth of consumer electronics and mobile handheld terminals. Hence, an improved feedback system for identifying movement and intensity of an external force is desired.

BRIEF SUMMARY OF THE INVENTION

A feedback system for identifying movement and intensity of an external force, comprises an operation plate and a pressure-sensing unit. The pressure-sensing unit includes an elastic member supporting the operation plate and a pressure sensor inside the elastic member. The pressure sensor comprises a pressure sensitive film. An inner side of the elastic member is filled with fluid material which acts on the pressure sensitive film. The operation plate is driven by the external force to be slant which extrudes the elastic member to deform so as to change fluid pressure of the fluid material limited in the elastic member, and such change of the fluid pressure can be sensed by the pressure sensitive film of the pressure sensor so as to identify the movement and the intensity of the external force.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

Figure 1:
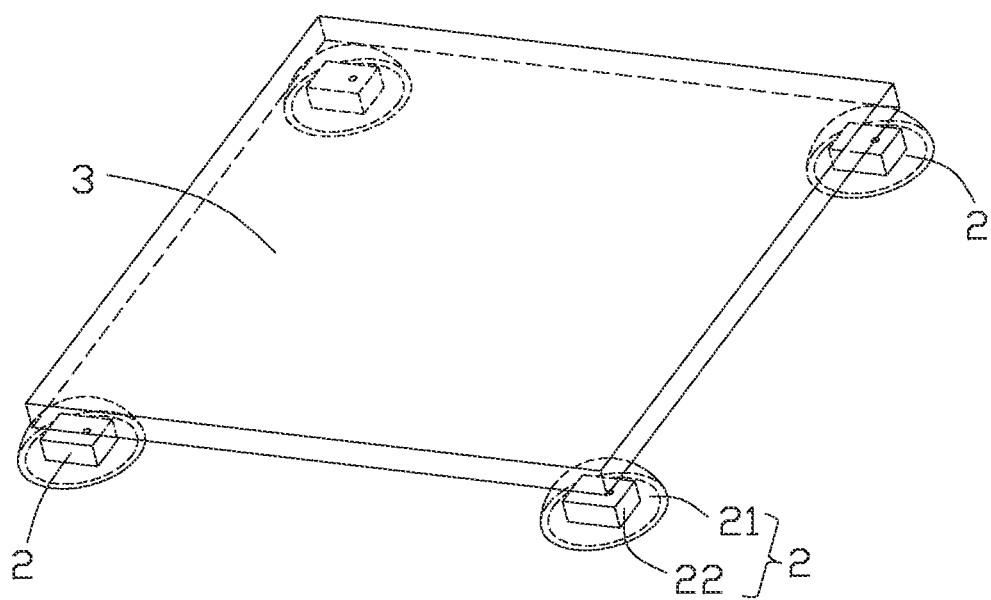
FIG. 1 is a partly perspective view of a feedback system with a plurality of pressure-sensing units mounted under an operation plate, in accordance with a first embodiment of the present invention.

Reference will now be made to the drawing figures to describe the embodiments of the present invention in detail. In the following description, the same drawing reference numerals are used for the same elements in different drawings.

First Embodiment

Figure 2:
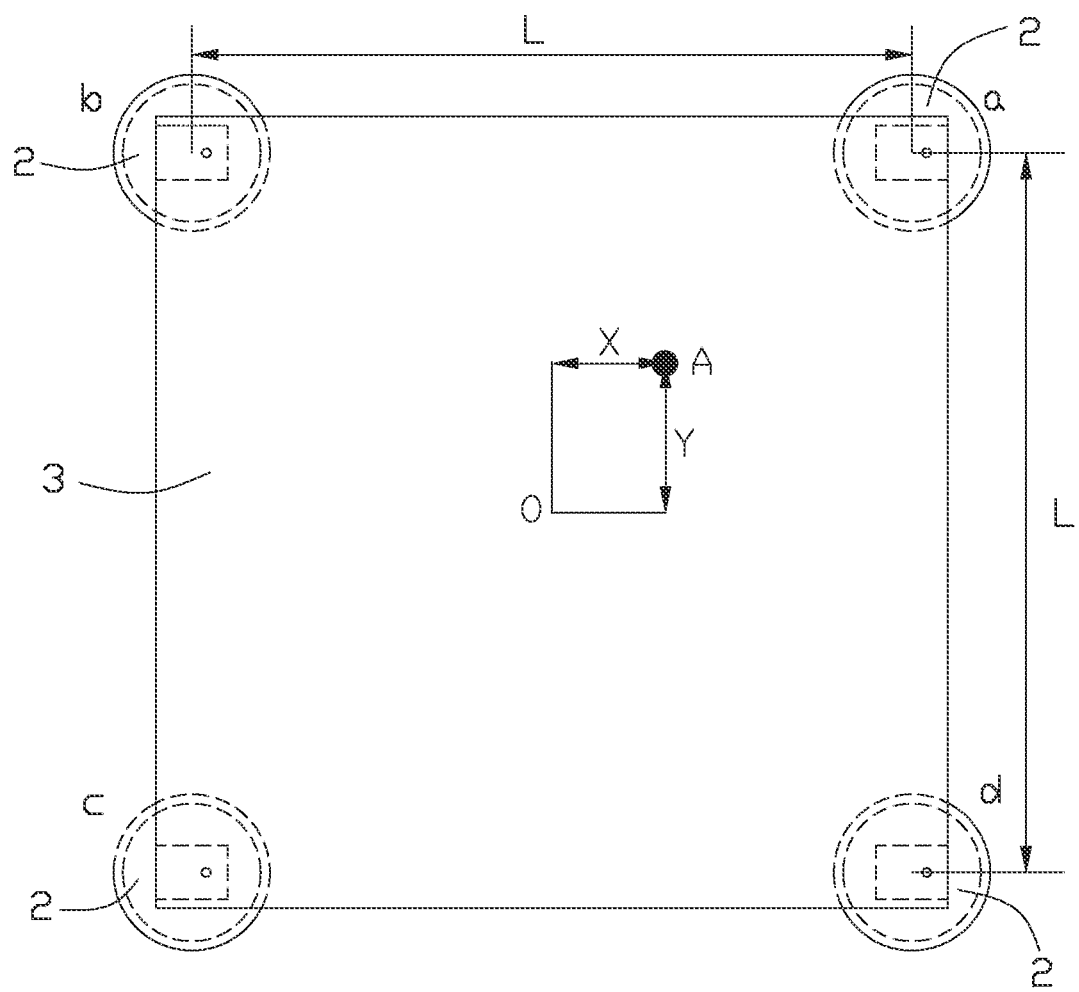
FIG. 2 is a top view of the feedback system as shown in FIG. 1.
Figure 3:
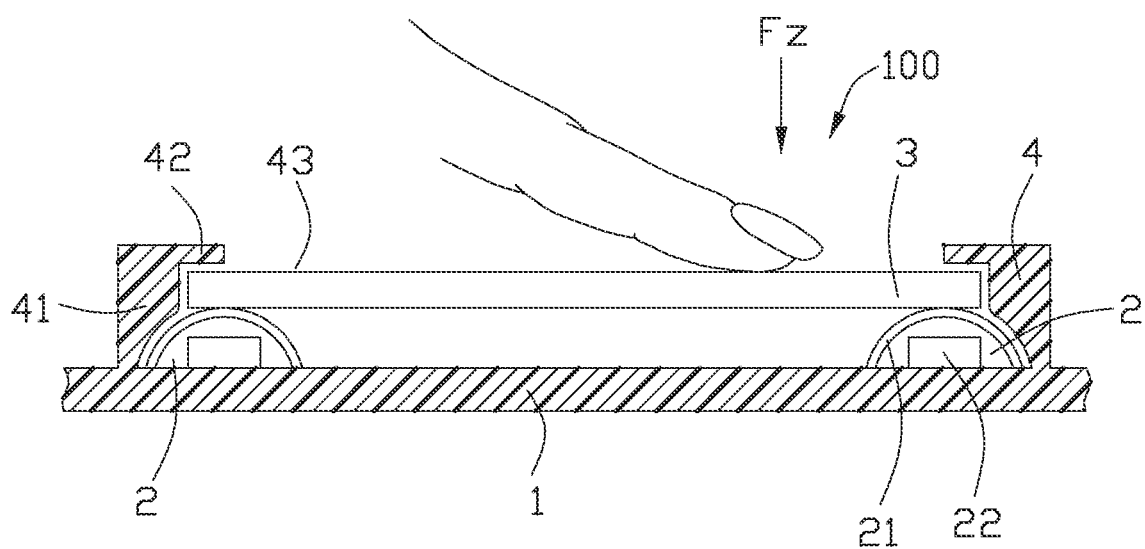
FIG. 3 is a cross-sectional view of the feedback system with the pressure-sensing units and the operation plate mounted to a support plate and a receiving block, and illustrating movement of a finger.
Figure 4:
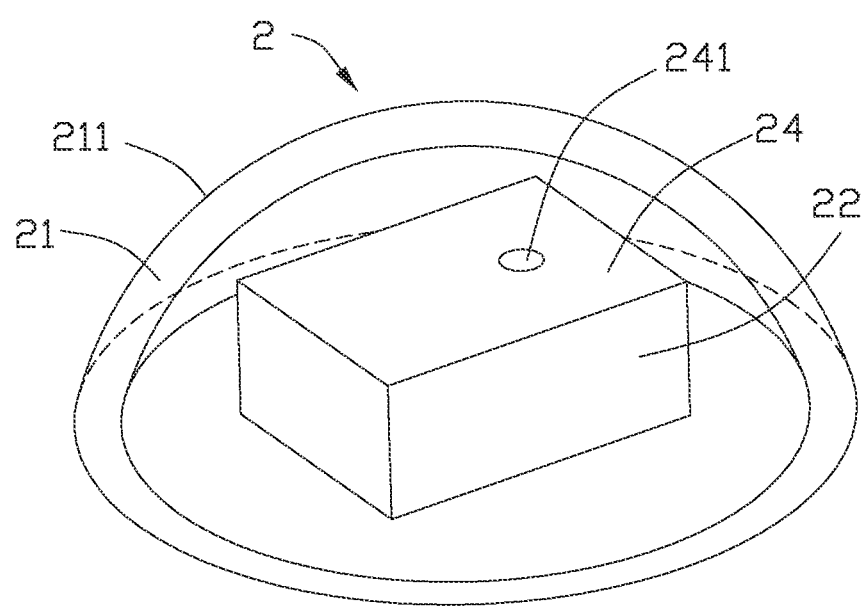
FIG. 4 is a perspective view of one of the pressure-sensing units as shown in FIG. 1.
Figure 5:
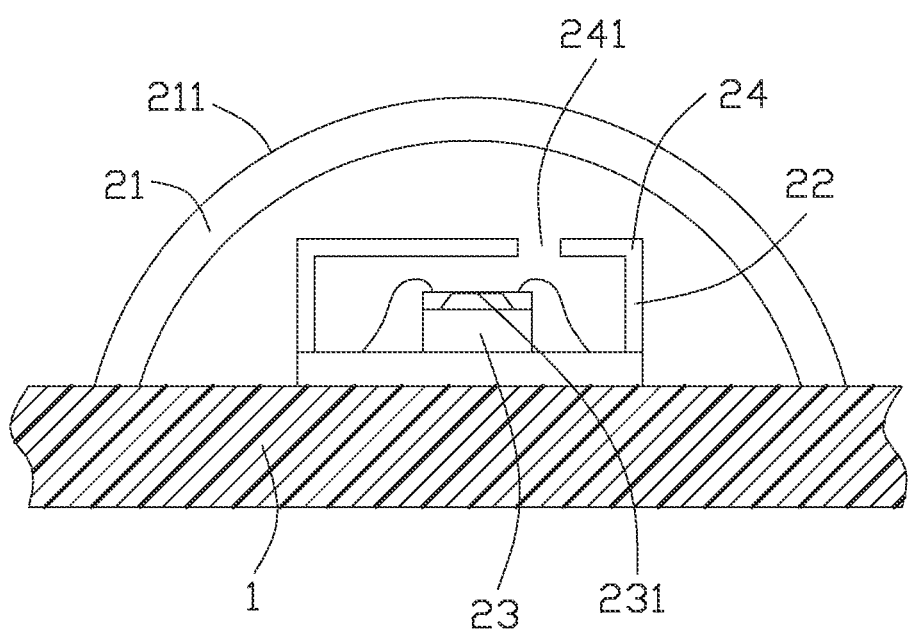
FIG. 5 is a cross-sectional view of the pressure-sensing unit as shown in FIG. 4.

FIGS. 1-3 illustrate a feedback system 100 for identifying movement and intensity of an external force. The feedback system 100 includes a flat support plate 1, a plurality of pressure-sensing units 2 mounted on the support plate 1, an operation plate 3 upwardly supported by the pressure-sensing units 2, and a receiving block 4 fastened to the support plate 1 for restricting upward movement of the operation plate 3 to avoid disassembly of the operation plate 3 and the receiving block 4. Referring to FIGS. 2, 4 & 5, each pressure-sensing unit 2 includes a half-ball shaped elastic member 21 and a pressure sensor 22. The elastic member 21 is hollow in order to receive the pressure sensor 22. An inner side of the elastic member 21 is filled with fluid material surrounding the pressure sensor 22. The fluid material is gas or liquid or glue etc. According to the preferred embodiment of the present invention, the fluid material is air for lower costs. The pressure sensor 22 includes a sensor chip 23 and a package 24 covering the sensor chip 23 for protection of the sensor chip 23. Referring to FIGS. 4 and 5, the package 24 is rectangular in shape and defines a through hole 241 through a top wall of the package 24. The sensor chip 23 comprises a pressure sensitive film 231 and the fluid material directly acts on the pressure sensitive film 231 via the through hole 241. According to the first embodiment of the present invention, the operation plate 3 is rectangular shaped and the plurality of pressure-sensing units 2 are mounted on corners of the operation plate 3. Besides, each elastic member includes an arced surface 211 for supporting the operation plate 3 as shown in FIG. 5.

Referring to FIG. 3, the receiving block 4 includes a vertical portion 41 fixed to the support plate 1 and a limiting stopper 42 horizontally extending from a top end of the vertical portion 41. An opening 43 is formed by the limiting stopper 42, and a first side of the operation plate 3 is exposed to the exterior through the opening 43 to be contacted by a finger. The limiting stopper 42 is located over the operation plate 3 for restricting upward movement of the operation plate 3. The receiving block 4 is unitarily formed with the support plate 1 according to the illustrated embodiment of the present invention. However, alternatively, the receiving block 4 and the support plate 1 can be separately formed, and then the receiving block 4 is fastened to the support plate 1.

The fluid material is limited in the inner side of the elastic member 21 and restricted by the support plate 1. The elastic member 21 is made of gas-impermeability materials, such as metal or organic materials. Referring to FIGS. 2 and 3, according to the first embodiment of the present invention, the number of the pressure-sensing units 2 is four and the pressure-sensing units 2 are arranged in a square shape which has a center O. The four pressure-sensing units 2 are labeled a, b, c, and d, respectively, and the actual side length of the square is marked L. Referring to FIG. 3, when the finger puts a certain force Fz at a point A which has a relative coordinate (x, y) with respect to the center O of the square, and the finger moves along an arrow on the first side of the operation plate 3, the forces applied to the pressure-sensing units 2 can be calculated by the following formulas: $F_a+F_b+F_c+F_d=F_z$; $L(2F-F_a-F_d)/2F_z=x$; $L(2F-F_a-F_b)/2F_z=y$; It is easy to be understood that a numerical value of the force Fz and an accurate position of the point A can be ascertained through calculating of the changes of the pressure-sensing units 2. As a result, the accurate position of the force Fz in the x-y plane, the moving speed of the force Fz, and the pressing force along a vertical direction z all can be calculated for controlling the machine. According to the preferred embodiment of the present invention, the force Fz can be divided into horizontal forces which slant the operation plate 3, and a vertical force which results in movement of the operation plate 3 along the vertical direction. Under this condition, the slant operation plate 3 extrudes the elastic members 21 to compress the volume V thereof. According the formula, $P=n\gamma T/V$, the change of volume V results in a corresponding change of the fluid pressure labeled P of the fluid material which is limited in the elastic members 21, wherein the letter n represents the amount of substance of the fluid material, and the letter y represents the constant of the fluid material. Such change of the fluid pressure can be sensed by the pressure sensitive film 231 of each pressure sensor 22. The pressure sensors 22 convert such change of fluid pressure into electric signals which are then inputted into a signal processing unit. The signal processing unit calculates all the signals of the pressure-sensing units 2 and finally achieves data of the contacting point and the intensity of the finger. Such data is sequently output to an execution unit so at to control the machine.

The feedback system 100 according to the preferred embodiment of the present invention can analysis three dimensional movement of the external force as well as the intensity of the external force. Besides, through the deformation of the elastic members 21 and the pressure change of the air limited in the elastic members 21 can realize comfortable hand feeling, higher reliability and lower cost.

Referring to FIG. 2, the elastic members 21 of the pressure-sensing units 2 partly extend beyond the operation plate 3 for stably supporting the operation plate 3. According to the illustrated embodiment of the present invention, the operation plate 3 functions of transmitting the pressure force of the finger to the pressure-sensing units 2. The elastic members 21 function of converting the pressure force into fluid pressure which can be identified by the pressure sensors 22.

Figure 6:
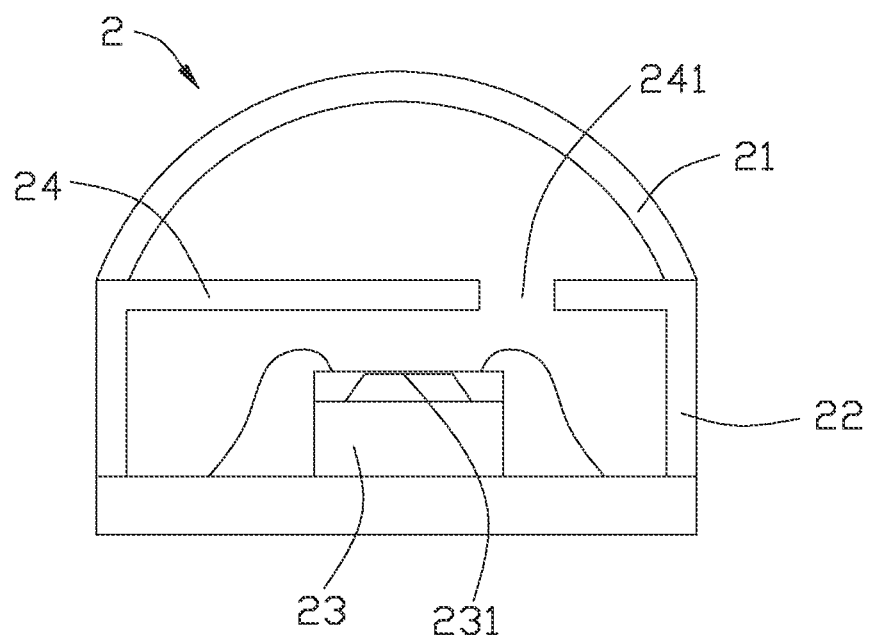
FIG. 6 is a cross-sectional view of the pressure-sensing unit as shown in FIG. 5 in a first alternative embodiment.

Referring to FIG. 6, according to a first alternative embodiment of the present invention, the elastic member 21 is fixed to the package 24 of the pressure sensor 22 to be a part of sensor packing. The fluid material limited inside the elastic member 21 directly acts on the pressure sensitive film 231 through the through hole 241.

Figure 7:
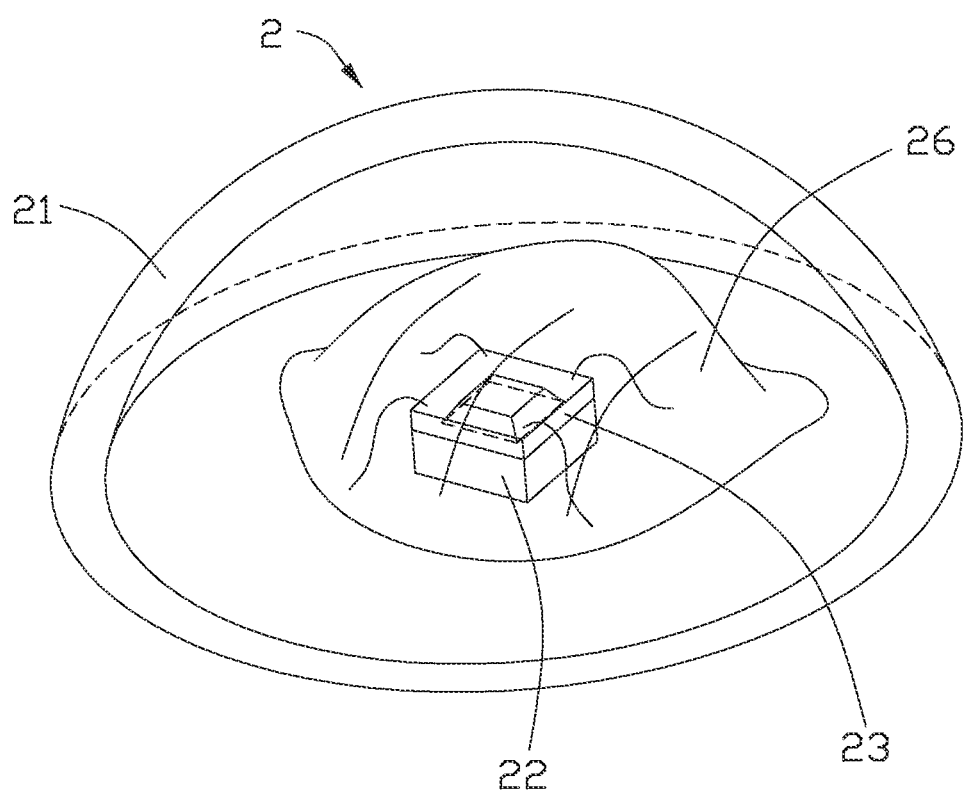
FIG. 7 is a perspective view of the pressure-sensing unit as shown in FIG. 4 in a second alternative embodiment.
Figure 8:
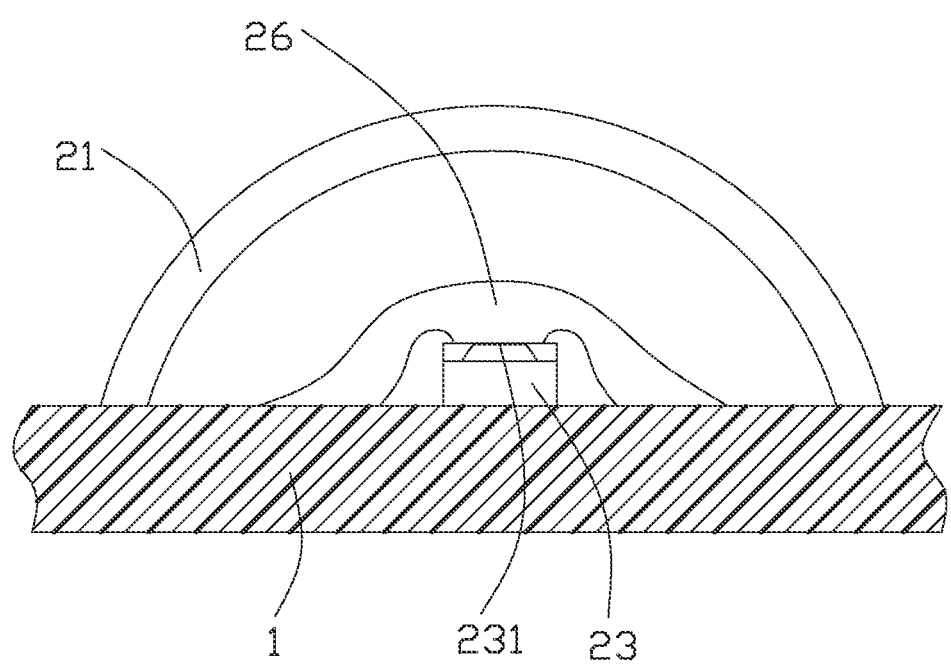
FIG. 8 is a cross-sectional view of the pressure-sensing unit as shown in FIG. 7.

Referring to FIGS. 7 and 8, according to a second alternative embodiment of the present invention, each pressure sensor 22 is covered by an insulating glue 26 for further protection. Under this condition, the package 24 as shown in FIG. 5 can be omitted. The insulating glue 26 is located inside the elastic member 21, and the fluid material is located between the elastic member 21 and the insulating glue 26. The pressure sensitive film 231 of each pressure sensor 22 is capable of sensing the change of the fluid pressure through the insulating glue 26.

Figure 9:
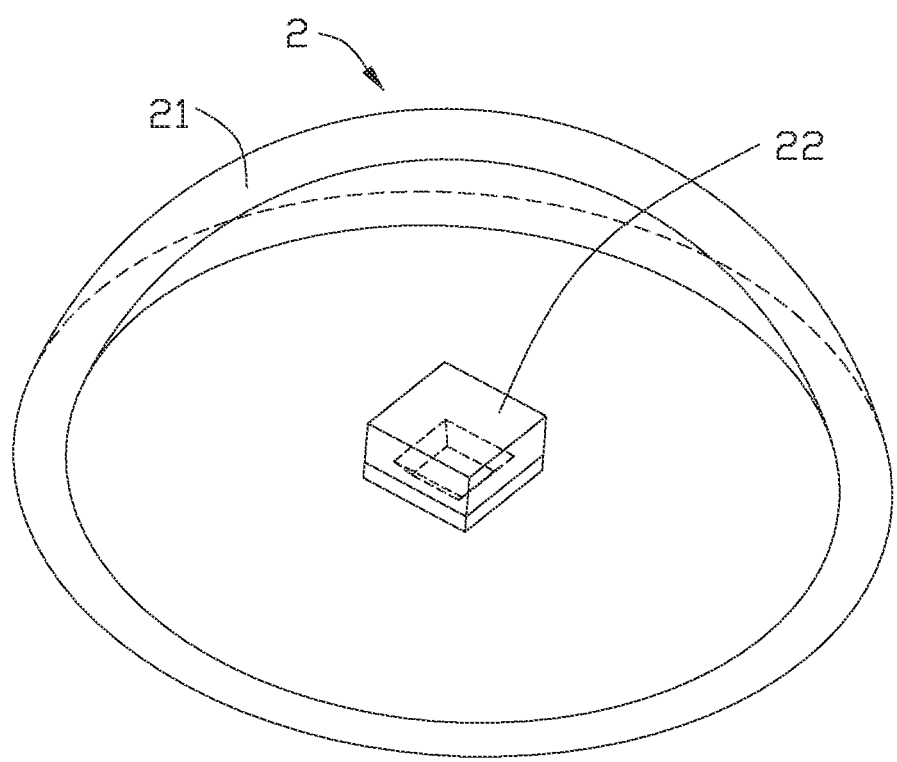
FIG. 9 is a perspective view of the pressure-sensing unit as shown in FIG. 4 in a third alternative embodiment.
Figure 10:
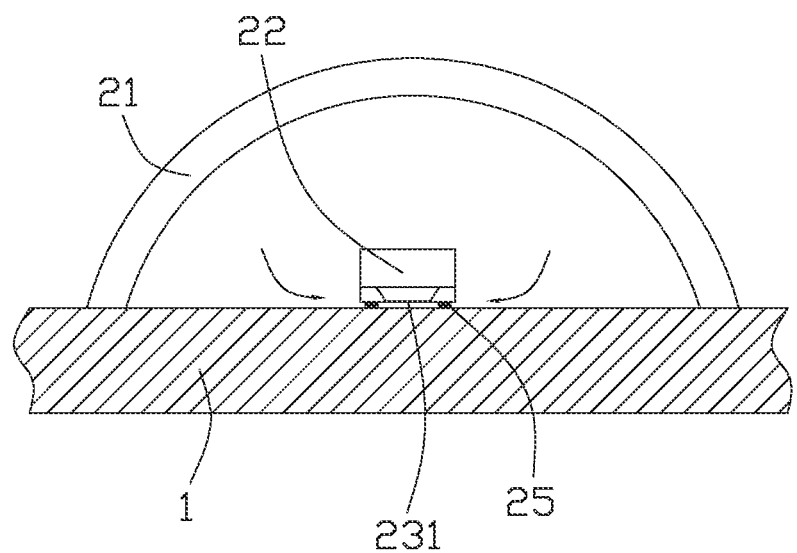
FIG. 10 is a cross-sectional view of the pressure-sensing unit as shown in FIG. 9.

Referring to FIGS. 9 and 10, according to a third alternative embodiment of the present invention, the pressure sensor 22 is reversely soldered to the support plate 1 via soldering pads 25. Under this condition, the pressure sensitive film 231 of the pressure sensor 22 directly faces the support plate 1 while the pressure sensitive film 231 is spaced a distance from the support plate 1. The fluid material can extend through the distance to act on the pressure sensitive film 231 of the pressure sensor 22.

Second Embodiment

Figure 11:
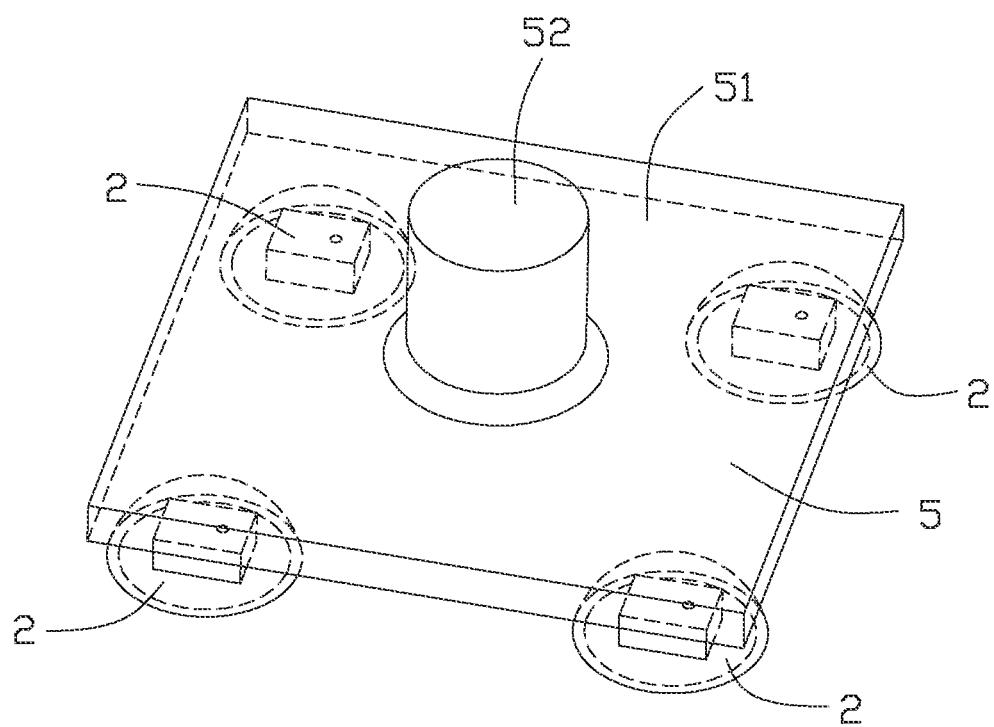
FIG. 11 is a partly perspective view of a feedback system with a plurality of pressure-sensing units mounted under an operation plate, in accordance with a second embodiment of the present invention.
Figure 12:
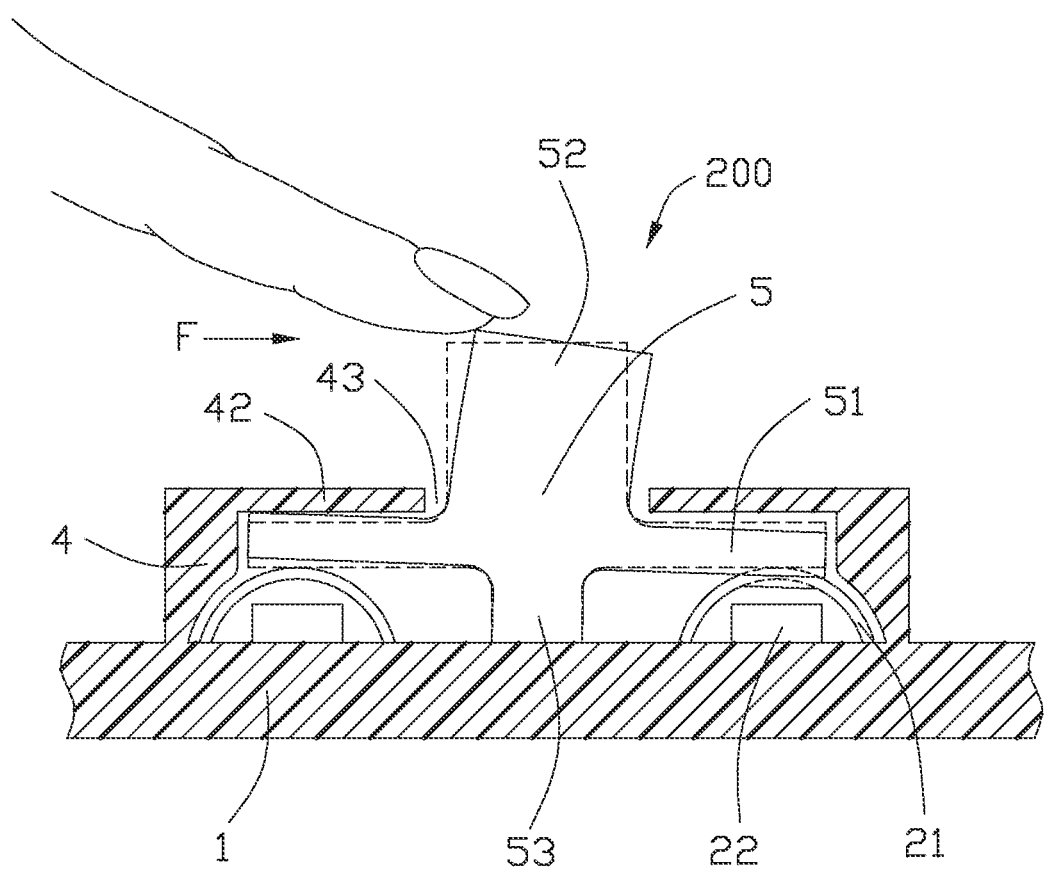
FIG. 12 is a cross-sectional view of the feedback system showing two different operating statuses of a finger.

Referring to FIGS. 11 and 12, another feedback system 200 for identifying movement and intensity of an external force is disclosed. The feedback system 200 is similar to the feedback system 100 of the first embodiment. The differences between them are that the feedback system 200 includes an unique operation plate 5 which comprises a plate portion 51 supported by the elastic members 21, an operating handle 52 upwardly extending from the plate portion 51, and a support lever 53 extending downwardly from the plate portion 51. The limiting stopper 42 is located over the plate portion 51 in order to restrict upward movement of the plate portion 51 to avoid disassembly thereof. The operating handle 52 is integrally formed with the plate portion 51 and extends upwardly beyond the limiting stopper 42 through the opening 43 for being driven by a finger. The support lever 53 abuts against the support plate 1. The plate portion 51 and the support lever 53 are made of flexible materials to have intrinsic elasticity.

Referring to FIGS. 11 and 12, when the finger puts a certain force to the operation handle 52. The certain force can be divided into horizontal forces which slant the plate portion 51, and a vertical force which compresses the support lever 53 so that the plate portion 51 moves along a vertical direction. Under this condition, the slant plate portion 51 extrudes the elastic members 21 so at to change fluid pressure of the fluid material limited in the elastic members 21. Such change of the fluid pressure can be sensed by the pressure sensitive film 231 of the pressure sensor 22.

Figure 13:
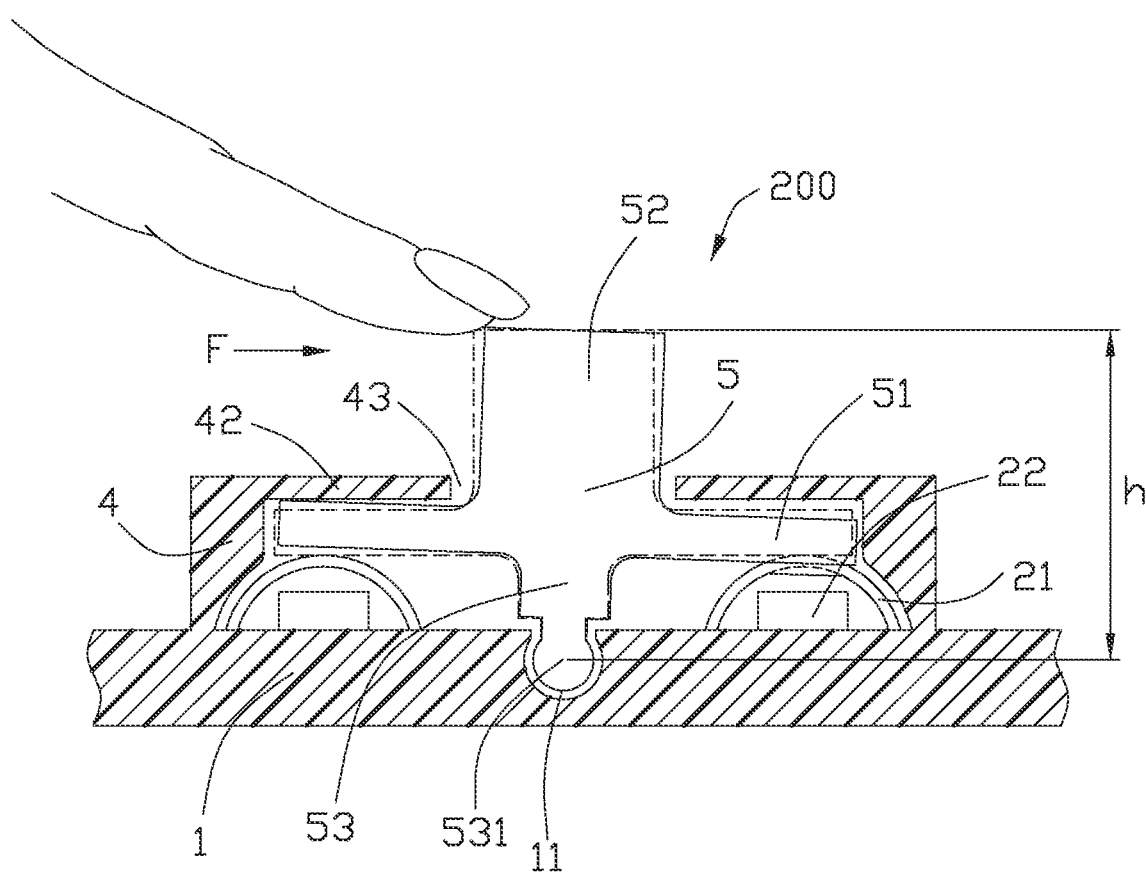
FIG. 13 is a schematic cross-sectional view of the feedback system showing two different operating statuses of the finger according to an alternative embodiment of the present invention.
Figure 15:
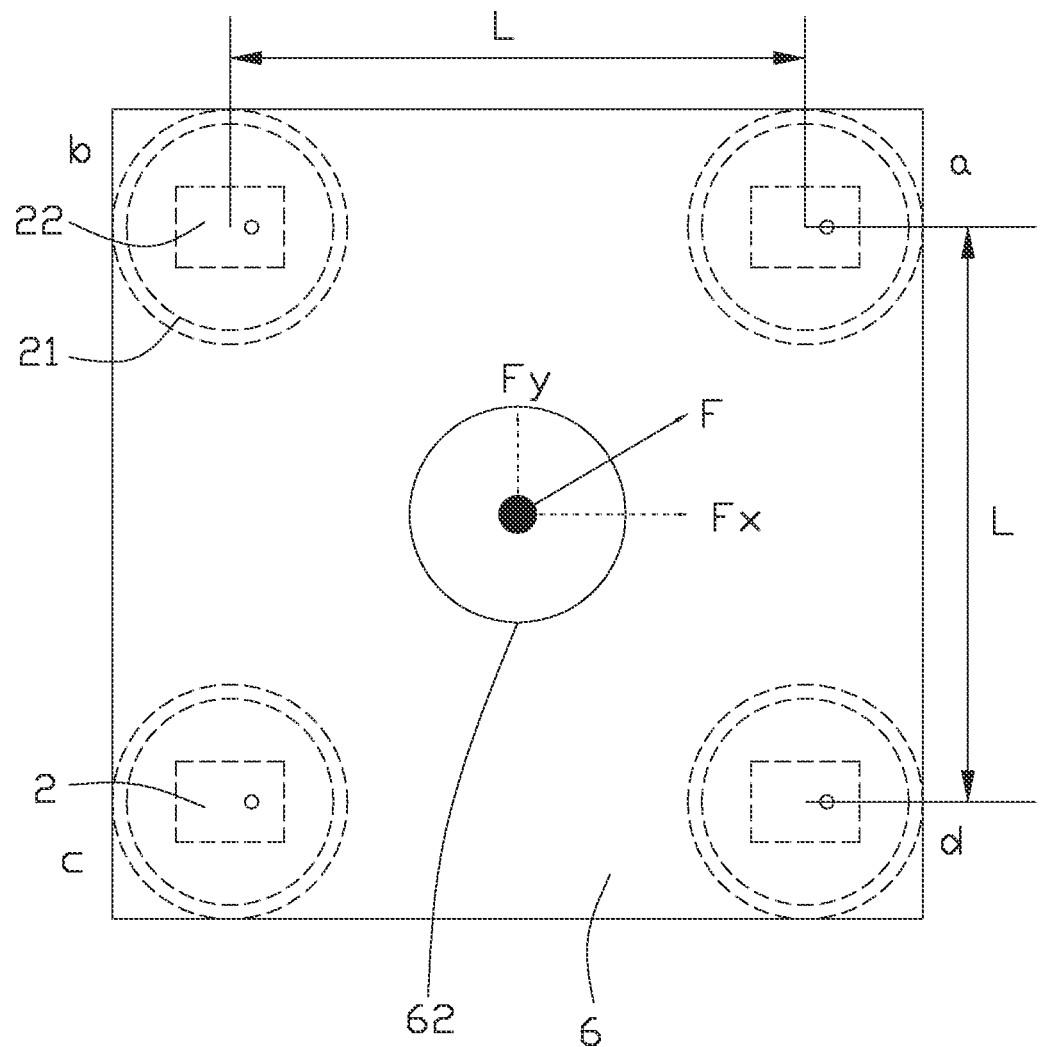
FIG. 15 is a top view of the feedback system as shown in FIG. 14.

Referring to FIG. 13, according to a first alternative embodiment of the second embodiment, the operation plate 5 includes an extension 53 protruding downwardly from the plate portion 51. The extension 53 includes a round head 531 which is rotatably received in a corresponding round hole 11 defined in the support plate 1. The round head 531 functions as a universal joint knuckle. The round hole 11 is deeper than the round head 531 in order to provide a vertical space for the round head 531 moving along the vertical direction. Referring to FIGS. 13 and 15, according to the second embodiment of the present invention, the number of the pressure-sensing units 2 is four and the pressure-sensing units 2 are arranged in a square shape. The four pressure-sensing units 2 are labeled a, b, c, and d, respectively, and the actual side length of the square is marked L. The actual height of the operation handle 52 with respect to the round head 531 is marked h. Referring to FIG. 15, when the finger puts a certain force F against the operation handle 52 along an arrow, the force F can be divided into a component force Fx along the direction x, a component force Fy along the direction y, and a component force Fz along the direction z. The forces applied to the pressure-sensing units can be calculated by the following formulas: $\sqrt{F_x^2+F_y^2}=F_{xy}$; $L(F_a+F_d-F_b-F_c)/2h=F_x$; $L(F_a+F_b-F_c-F_d)/2h=F_y$; $F_a+F_b+F_c+F_d=F_z$. It is easy to be understood that a numerical value of the force F and the moving direction thereof can be ascertained through calculating the changes of the pressure-sensing units 2. As a result, the accurate position of the force F in the x-y plane, the moving speed of the force F, and the pressing force along the vertical direction z all can be calculated for controlling the machine. According to the embodiment of the present invention, the certain force F is divided into horizontal forces which slant the plate portion 51, and a vertical force which results in movement of the plate portion 51 along the vertical direction. Under this condition, the slant plate portion 51 extrudes the elastic members 21 so at to change fluid pressure of the fluid material limited in the elastic members 21. Such change of the fluid pressure can be sensed by the pressure sensitive film 231 of the pressure sensor 22.

Third Embodiment

Figure 14:
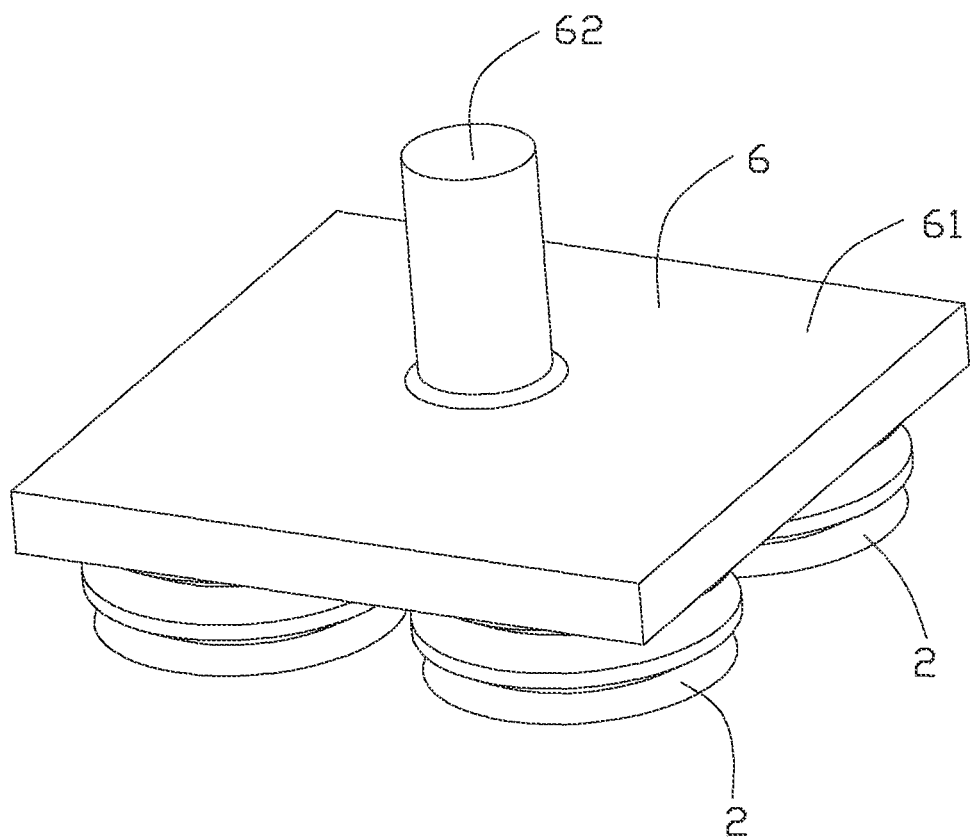
FIG. 14 is a partly perspective view of a feedback system with a plurality of pressure-sensing units mounted under an operation plate, in accordance with a third embodiment of the present invention.
Figure 16:
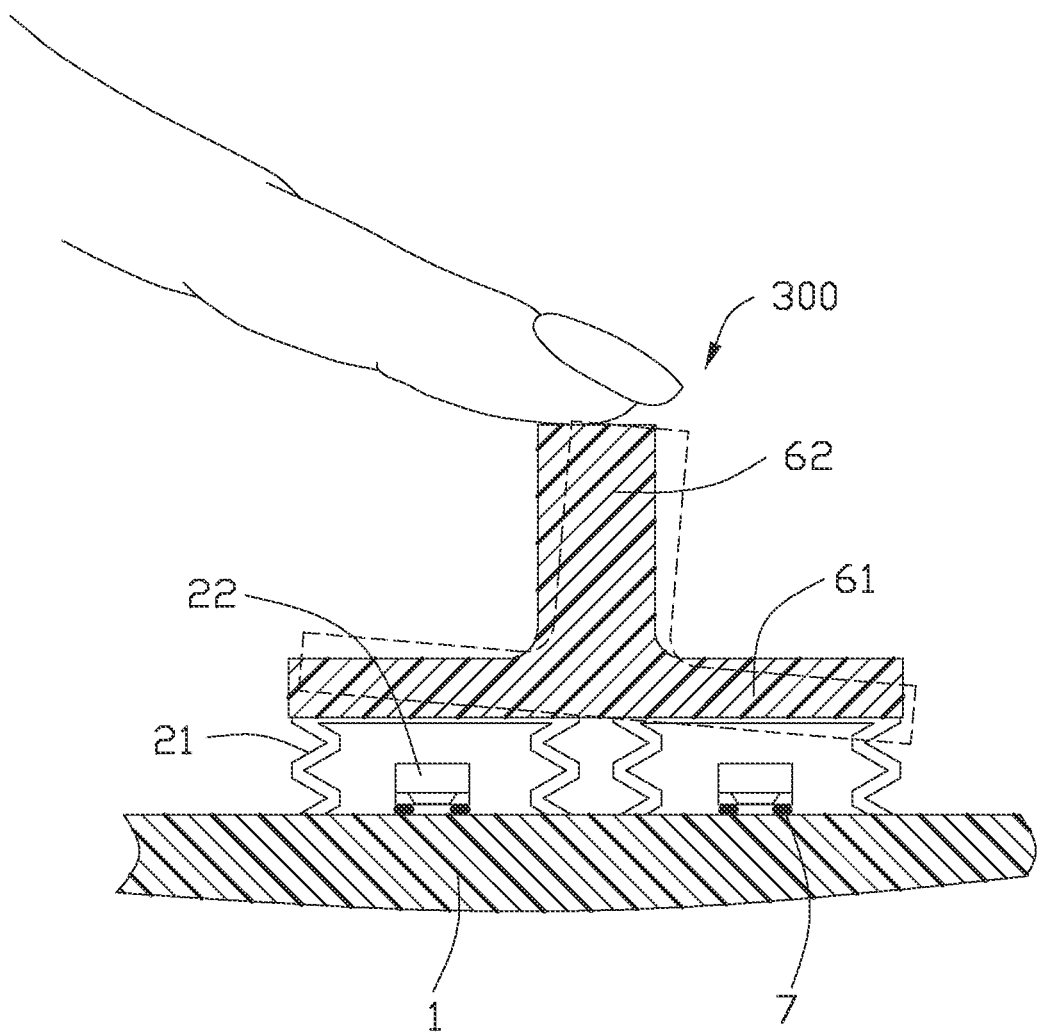
FIG. 16 is a schematic cross-sectional view of the feedback system as shown in FIG. 14, showing two different operating statuses of the finger.

Referring to FIGS. 14 to 16, another feedback system 300 for identifying movement and intensity of an external force is disclosed. The feedback system 300 is similar to the feedback system 200 of the second embodiment. The differences between them are the structure of the operation plate and the elastic member. The feedback system 300 includes an unique operation plate 6 which comprises a plate portion 61 supported by a plurality of pressure-sensing units 2, and an operating handle 62 upwardly extending from the plate portion 61. The operating handle 62 functions of transmitting the pressure force of the finger to the pressure-sensing units 2. The elastic members 21 function of converting the pressure force into fluid pressure which is identified by the pressure sensors 22. Each elastic member 21 of the pressure-sensing units 2 includes an upstanding corrugated tub with different diameters. The corrugated tub is center hollow in order to receive the pressure sensor 22, and the corrugated tub is compressible along the vertical direction. The pressure sensors 22 are reversedly soldered to the support plate 1 via soldering pads 25 similar to FIG. 10.

Referring to FIG. 16, wherein the finger puts a certain force to the operation handle 62 along the arrow. The certain force is divided into horizontal forces which slant the plate portion 61, and a vertical force which presses the plate portion 61 along the vertical direction. Under this condition, the slant plate portion 61 extrudes the elastic members 21 so at to change fluid pressure of the fluid material limited in the elastic members 21. Such change of the fluid pressure can be sensed by the pressure sensitive film 231 of the pressure sensor 22. Such design of the corrugated tub can be easily adjusted by changing the thickness and the structure of the corrugated tub, which optimizes the deformation modes of the fluid pressure limited in the corrugated tub. As a result, subsequent calculation arithmetic can be simplified.

It is to be understood, however, that even though numerous, characteristics and advantages of the present invention have been set forth in the foregoing description, together with details of the structure and function of the invention, the disclosed is illustrative only, and changes may be made in detail, especially in matters of number, shape, size, and arrangement of parts within the principles of the invention to the full extent indicated by the broad general meaning of the terms in which the appended claims are expressed.

What is claimed is:

1. A feedback system for identifying movement and intensity of an external force, comprising:
   an operation plate;
   a pressure-sensing unit comprising an elastic member supporting the operation plate and a pressure sensor inside the elastic member, the pressure sensor comprising a pressure sensitive film;
   a support plate on which the elastic member and the pressure sensor are mounted; and
   a receiving block fastened to the support plate, the receiving block comprising a limiting stopper over the operation plate in order to restrict upward movement of the operation plate; wherein
   an inner side of the elastic member is filled with fluid material which acts on the pressure sensitive film; and wherein
   the operation plate is driven by the external force to be slant which extrudes the elastic member to deform so as to change fluid pressure of the fluid material limited in the elastic member, and such change of the fluid pressure can be sensed by the pressure sensitive film of the pressure sensor so as to identify the movement and the intensity of the external force.

2. The feedback system as claimed in claim 1, wherein the operation plate comprises a first side for being contacted by a finger and a second side opposite to the first side for being supported by the elastic member.

3. The feedback system as claimed in claim 1, wherein the pressure sensor comprises a sensor chip having the pressure sensitive film, and a package covering the sensor chip, elastic member being fixed to the package, the package comprising a through hole through which the fluid material directly acts on the pressure sensitive film.

4. The feedback system as claimed in claim 1, wherein the pressure-sensing unit is mounted on a bottom side of the operation plate, and the elastic member is provided with an arced surface abutting against the operation plate.

5. The feedback system as claimed in claim 1, wherein the pressure-sensing unit is mounted on a bottom side of the operation plate, and the elastic member includes an upstanding corrugated tube with different diameters, the corrugated tube being center hollow in order to receive the pressure sensor, and the corrugated tube being compressible along a vertical direction.

6. The feedback system as claimed in claim 1, wherein the pressure sensor is reversely fixed to the support plate under a condition that the pressure sensitive film is spaced a distance from and directly faces the support plate.

7. The feedback system as claimed in claim 1, wherein the operation plate comprises a plate portion supported by the elastic member and an operating handle fixed to the plate portion, the limiting stopper being located over the plate portion to restrict upward movement of the plate portion, the operating handle protruding upwardly beyond the limiting stopper for being driven by the external force.

8. The feedback system as claimed in claim 7, wherein the operating handle is integrally formed with the plate portion.

9. The feedback system as claimed in claim 7, wherein the operation plate comprises a support lever protruding downwardly from the plate portion, the support lever extending opposite to the operating handle and abutting against the support plate.

10. The feedback system as claimed in claim 9, wherein the support lever is made of a flexible material so as to be deformable along a vertical direction.

11. The feedback system as claimed in claim 7, wherein the operation plate comprises an extension protruding downwardly from the plate portion, the extension extending opposite to the operating handle and comprising a round head which is rotatably received in a round hole defined in the support plate.

12. The feedback system as claimed in claim 11, wherein the round hole is deeper than the round head in order to provide a vertical space for the round head moving along a vertical direction.

13. The feedback system as claimed in claim 1, further comprising insulating glue covering the pressure sensor for protection, the insulating glue residing in the inner side of the elastic member, and the fluid material being located between the elastic member and the insulating glue, the pressure sensitive film of the pressure sensor being capable of sensing the fluid pressure through the insulating glue.

14. The feedback system as claimed in claim 1, wherein three dimensional movement of the external force as well as the intensity of the external force can be sensed by the feedback system.

15. The feedback system as claimed in claim 1, wherein the fluid material is gas or liquid or glue.

16. The feedback system as claimed in claim 1, wherein the fluid material is air.

17. The feedback system as claimed in claim 1, wherein the elastic member partly extends beyond the operation plate.

18. The feedback system as claimed in claim 1, wherein the operation plate is rectangular shaped and a plurality of pressure-sensing units are mounted on corners of the operation plate.

* * * * *